United States Patent [19]

Moore

[11] 4,334,323
[45] Jun. 8, 1982

[54] SELF TRACKING TUNER

[75] Inventor: Frederic J. Moore, Des Plaines, Ill.

[73] Assignee: Zenith Radio Corporation, Glenview, Ill.

[21] Appl. No.: 184,719

[22] Filed: Sep. 8, 1980

[51] Int. Cl.³ ............................................. H04B 1/16
[52] U.S. Cl. .................................. 455/179; 455/184; 455/186; 455/195
[58] Field of Search ................. 358/191.1; 455/179, 455/184, 186, 195, 197

[56] References Cited

U.S. PATENT DOCUMENTS

| | | | |
|---|---|---|---|
| 3,990,027 | 11/1976 | Kawashima | 455/186 X |
| 4,122,395 | 10/1978 | Schotz et al. | 455/186 X |
| 4,130,804 | 12/1978 | Mogi et al. | 455/186 |
| 4,270,220 | 5/1981 | Hagiwara et al. | 455/186 X |

Primary Examiner—Robert L. Richardson
Attorney, Agent, or Firm—Jack Kail; John Coult

[57] ABSTRACT

A tuner includes a channel or target frequency selection means, a tunable oscillator, a tunable circuit means having at least one tunable circuit, and tuning means, responding to the target frequency select means, for automatically and individually tuning the tunable circuit. Typically the tuner includes several tunable circuits, which are tuned successively.

The illustrated embodiments have three individually controlled varactor tuned circuits and a varactor tuned oscillator. To move to a new target frequency, the tuner locks the oscillator to the target frequency via a phase locked loop. This target frequency is inputted to the first varactor tuned circuit, and a microprocessor cooperating with a DC detector for sensing the output of the set of tuned circuits steps a voltage step generator which controls the first varactor tuned circuit while the tuning of the other varactor tuned circuits is held fixed. The microprocessor adjusts the voltage step generator to maximize the DC output and signals corresponding to this voltage are stored in a memory. Next, the second varactor tuned circuit having a corresponding voltage step generator is adjusted in the same way, and corresponding signals are stored in memory. This continues until all varactor tuned circuits are locked to the target frequency, after which the varactor tuned oscillator is returned to its standard frequency of 43.5 MHz greater than the target frequency.

In a second embodiment, one oscillator remains at 43.5 MHz higher than the target frequency and cooperates with a mixer and a 43.5 MHz oscillator to provide a target frequency signal for use in the self-alignment procedure.

24 Claims, 2 Drawing Figures

SELF TRACKING TUNER

BACKGROUND OF THE INVENTION

The present invention relates to tuners, and has particular applicability to television receiver tuners, although the present invention will be applicable to tuners for other types of devices.

It is typical in the television industry today to form a tuner having a set of serially arranged varactor tuned circuits or "tanks" receiving a signal from the television antenna. The tuned circuits provide an output which is highly selective in frequency so as to minimize cross modulation and other undesired signals when the circuits are properly tuned. This set of varactor tuned circuits has heretofore been ganged so that a single input voltage controls every varactor tuned circuit. Generally this set of tuned circuits is aligned in a factory operation wherein a technician will input a frequency corresponding to a low television channel to the set and adjust each tuned circuit for maximum response at that one frequency. Then further alignment is done for a higher frequency channel and an intermediate frequency channel. The alignment compensates for the tolerances in the components forming each tuned circuit. After the alignment, the three channels will be properly aligned. However, often there will be some mistracking on other channels which have not been aligned.

It is an object of the present invention to provide a tuner which overcomes this mistracking on other channels.

Another object of the present invention is to provide a tuner which aligns itself automatically and therefore requires minimal or no factory adjustment.

Another object of the invention is to provide a method for automatically and electronically adjusting the set of tunable circuits in a television tuner.

BRIEF DESCRIPTION OF THE DRAWINGS

Various features and advantages of the present invention will be apparent from the following description of preferred embodiments wherein reference is made to the accompanying drawings in which.

DESCRIPTION OF PREFERRED EMBODIMENTS

Figure 1:
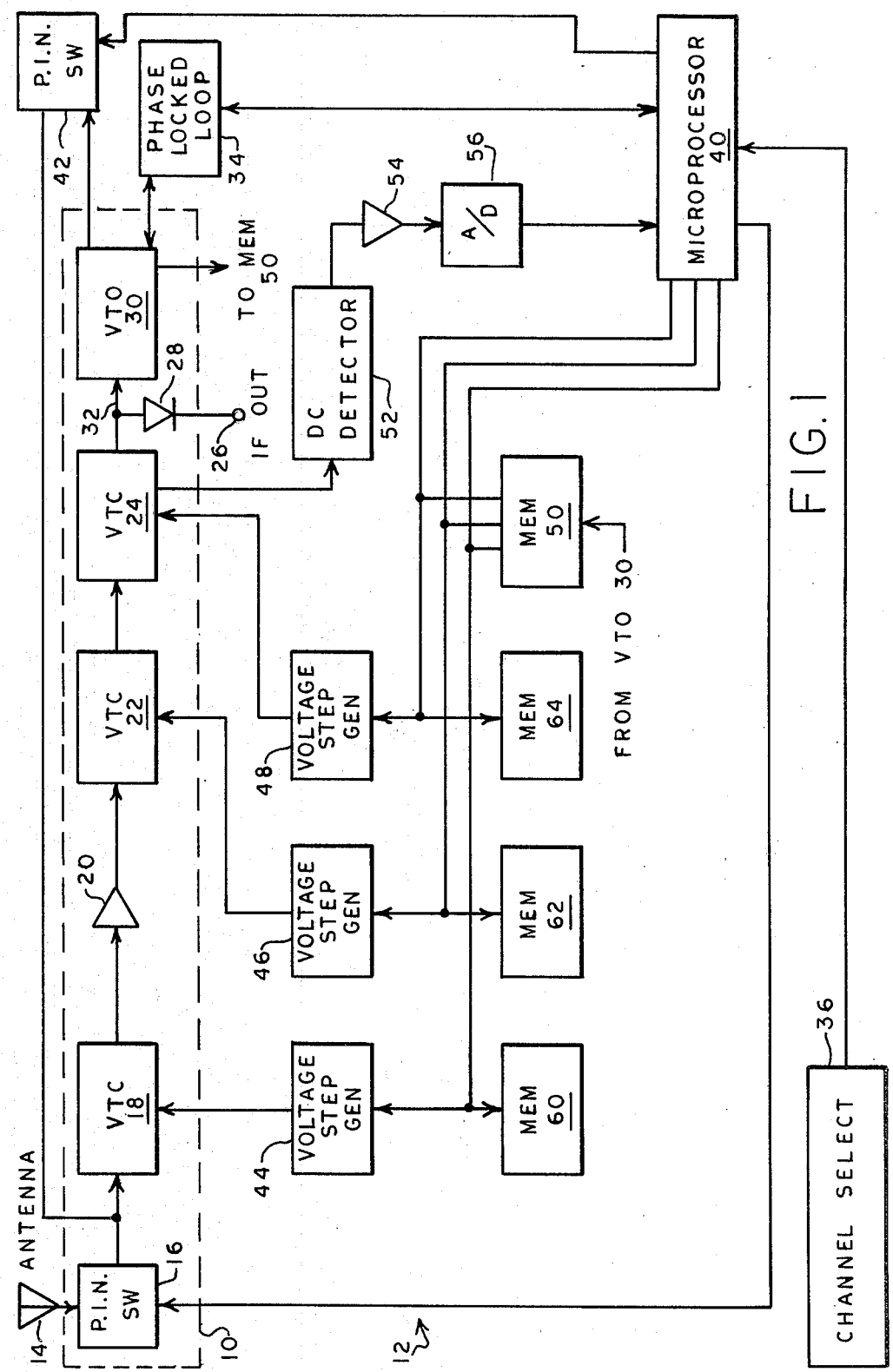
FIG. 1 is a block diagram of a first embodiment of a self-tracking tuner according to the present invention.

Referring to FIG. 1, a self tracking tuner comprises a tuner portion 10 within the dotted box and a control portion 12 outside the dotted box. An antenna 14 is coupled to an input to the tuner by a p-i-n switch 16. Portion 10 includes a set of tunable circuits which illustratively takes the form of a first varactor tuned circuit ("VTC") 18 coupled by an operational amplifier 20 to a second varactor tuned circuit 22 whose output is, in turn, applied to a third varactor tuned circuit 24.

An intermediate frequency output 26 of tuner portion 10 is coupled to the output of VTC 24 by a diode 28. A tunable oscillator, illustratively a varactor tuned oscillator ("VTO") 30, is coupled to IF output 26 either via a lead 32 or by RF coupling.

As is typical in the art, VTO 30 oscillates at a frequency which is about 43.5 MHz higher than the on-channel frequency. This is assured by a phase locked loop system 34 which includes the customary elements such as a phase lock loop, a prescaler divider circuit, local references such as a set of crystal oscillators or other types of oscillators, a comparator, and so forth. The phase locked loop system 34 cooperates with VTO 30 in the customary manner to insure that VTO 30 is tuned to the proper frequency so that a proper IF signal will be generated.

The configuration and operation of other elements of control portion 12 will be described by reference to an example wherein the system user directs the illustrated self-tracking tuner to tune to a different frequency. It is to be understood, of course, that similar operation will obtain during start-up.

The system user may direct the self tracking tuner to tune to a different frequency by entering an appropriate command on a channel select device 36 which may comprise a mechanical or electronic switch arrangement as is well known in the art. The channel select in a television receiver includes a limited number of frequencies which may be selected, and corresponding reference oscillators or means for generating reference frequencies are provided in the phase locked loop system 34.

Channel select 36 is coupled to a microprocessor 40, and after microprocessor 40 determines that it has been instructed to move the self tracking tuner to a new frequency, hereinafter referred to as the target frequency, it directs phase locked loop system 34 to lock VTO 30 to the target frequency. Microprocessor 40 also directs p-i-n switch 16 to disconnect antenna 14 from the input to VTC 18. Means for selectively coupling the frequency output of VTO 30 to the input of VTC 18 is then activated by microprocessor 40. Illustratively, such selective coupling means may comprise a second p-i-n switch 42.

Next, VTC 18, VTC 22, and VTC 24 are tuned to the target frequency. Each of these tunable circuits corresponds to a frequency controller illustratively taking the form of voltage step generators 44, 46 and 48 respectively. Preferably, the tunable circuits are individually adjusted, and illustratively, VTC 18 is adjusted first, although it will be understood that varying the sequencing is within the scope of the present invention. In the adjustment of VTC 18, both VTC 22 and VTC 24 are held at fixed tuning stages. Illustratively, this may be achieved by reading out from any suitable memory device 50 (such as a sample and hold circuit, a random access memory (RAM), or other device) a signal corresponding to a nominal initial tuning frequency which preferably will be within the range of frequencies which may be selected by channel select 36. Illustratively, memory 50 may be coupled to VTO 30 to use its voltage as the nominal initial time frequency control voltage. Memory 50 is coupled to voltage step generator 46 and 48 which control their corresponding VTC's 22 and 24, respectively, to hold a fixed tuning state or states.

Microprocessor 40 monitors the output level of the set of tunable circuits. Illustratively, a DC detector 52 receives a signal from VTC 24, and its output is amplified by an operational amplifier 54. Its output is digitized by an analog-to-digital (A/D) converter 56. This digital representation of the output level of the varactor tuned circuits 18, 22 and 24 is then inputted to microprocessor 40. It is to be understood that this arrangement is illustrative, and that other means may be used for deriving a signal representing the output level of any VTC 18, 22 or 24.

Microprocessor 40 next causes voltage step generator 44 to step through a sequence of voltage steps, illustratively an ascending series. During this procedure, the detected DC output level will vary and experience a maxima. Microprocessor 40 will determine that a maxima has been passed and will direct generator 44 to return to the voltage corresponding to the maxima. Signals corresponding to this controlling of generator 44 will be stored in a storage means such as a first memory 60. By this operation, VTC 18 will be accurately, automatically and electronically tuned to the target frequency.

Next, microprocessor 40 tunes VTC 22 in the same manner. VTC 24 is held at a nominal initial setting and microprocessor 40 directs voltage step generator 46 to step through a voltage step sequence. After a maxima is determined, control signals are stored in the storage means which illustratively includes a second memory 62 corresponding to step generator 46.

This method is continued until every tunable circuit in the tuner is tuned to the target frequency. In the illustrative embodiment of FIG. 1, a third VTC 24 is shown, and the self tracking tuner storage means includes a corresponding memory 64 for storing control signals for voltage step generator 48.

Microprocessor 40 then directs phase locked loop 34 to adjust VTO 30 to oscillate at 43.5 MHz higher than the target frequency as is customary for television receiver tuners. P-i-n switch 42 is then directed to decouple the output of VTO 30 from the input to VTC 18, and p-i-n switch 16 is directed by microprocessor 40 to pass signals from antenna 14 into VTC 18. At this time, the tuner will be fully operational and properly tuned to the target frequency.

Figure 2:
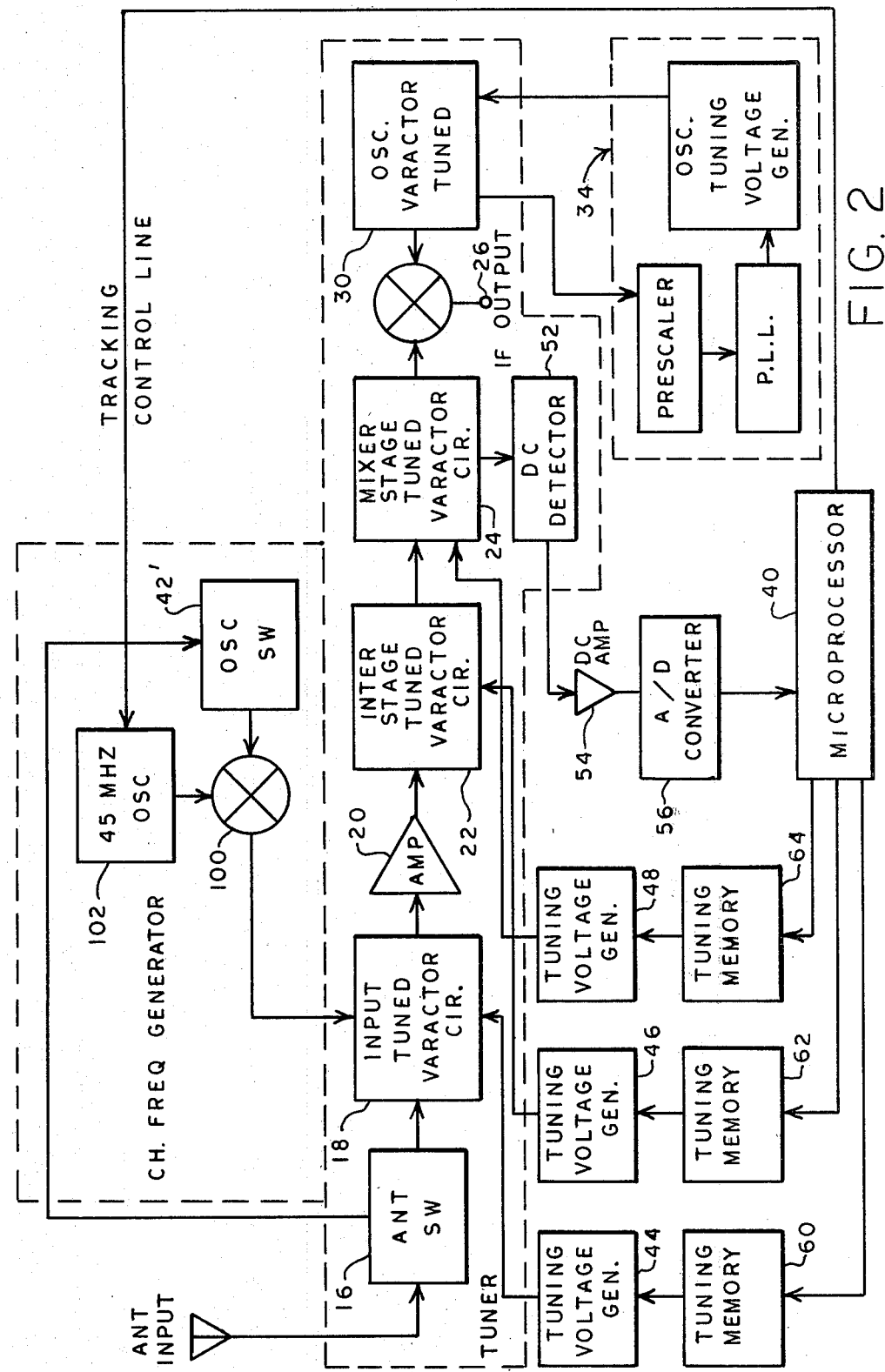
FIG. 2 is a block diagram of a second embodiment of a self-tracking tuner according to the present invention.

A second embodiment of a tuner according to the present invention is shown in FIG. 2. It will be seen that this embodiment is similar in many respects to that of FIG. 1, and in FIG. 1 and FIG. 2, corresponding elements are identified by the same reference numerals. In this second embodiment, however, the oscillator 30 always oscillates at 43.5 MHz higher than the on-channel frequency. During the tuning stage, when an oscillator switch 42' is closed, the signal from VTO 30 is first mixed in a mixer 100 with a 43.5 MHz signal outputted by a crystal or other type of oscillator 102. This results in sum and difference components and the lower frequency corresponding to the on-channel frequency is inputted to VTC 18. Consequently, VTO 30 need not be tuned to the on-channel frequency but can remain at 43.5 MHz higher than the on-channel, target frequency.

FIG. 2 also illustrates a slightly different arrangement for memories 60, 62 and 64. As indicated above, these memories comprise storage means for storing the control signals for voltage generators 44, 46 and 48. Various arrangements of storage means can be used. For example, although three separate memories 60, 62 and 64 are shown, one memory such as a RAM could be used. Another variation is shown in FIG. 2, where the memories couple microprocessor 40 to the respective voltage generators 44, 46 and 48, whereas in FIG. 1, such memories were shown as being connected parallel to the corresponding generators. This illustrates that the various configurations can be made to associate the storage means with the voltage generators.

It will also be noted that FIG. 2 does not include the memory device 50 of FIG. 1, which, it will be recalled, was used to set VTC's 22 and 24 to a nominal initial tuning frequency during the tuning of VTC 18. During the tuning operation in the FIG. 2 embodiment, VTC's 22 and 24 may remain tuned to the prior target frequency, rather than being tuned to a different, nominal initial frequency.

It will be clear from the foregoing description that self tracking tuners according to the present invention achieve the objects stated, namely, they need no factory alignment and automatically, electronically and accurately tune to the target frequency. Because the self tracking tuner requires no factory alignment, a substantial cost saving is achieved. Moreover, there is no misalignment of the tuner for any frequency which may be selected.

To those who are skilled in the art it will be apparent that various other modifications, variations or embellishments may be made to the embodiments described herein within the scope of the present invention. For instance, the voltage step generators could be reduced in number to one and multiplexed to each varactor tuned circuit successively.

Second, after a first varactor tuned circuit is tuned, microprocessor 40 could use the control signals which maximized that first VTC to update the nominal tuning of the remaining VTC's which would be more accurate than the nominal tuning stored in memory 50. This would be followed by accurately tuning each VTC, but would result in a decrease in the time required for these operations because fewer steps from the voltage generator would be required.

According to a third variation, the detection means could be coupled to each varactor tuned circuit and multiplexed.

It will be appreciated that in a fourth variation the oscillator 30 may be selectively coupled to individual tunable circuits rather than to all tunable circuits simultaneously.

Fifth, the individual tuning circuits need not be tuned to identical frequencies. The self-tracking tuner may cause a respective, different frequency near the target frequency to be inputted to each VTC's. Each VTC would be tuned by the system for maximum output at its inputted frequency. Alternatively, the system could input the same, on-channel target frequency to the set of VTC's, tune the VTC's to the target frequency, and change one or more of the controlling voltages so that, for example, VTC 18 would be tuned to the target frequency, VTC 22 would be tuned to a frequency slightly below the target frequency, and VTC 24 would be tuned to a frequency slightly higher than the target frequency. This can be done by microprocessor 40 causing voltage step generator 46 to be set one or two (or any other number) steps below the voltage which results in a maxima for VTC 22. Voltage step generator 48 would be set to some number of steps greater than the voltage corresponding to a maxima for VTC 24.

Other modifications, variations or embellishments may be made, and it is to be understood that such variations, modifications and embellishments are intended to be embraced by the appended claims.

I claim:

1. In a tuner circuit of the type having a tunable oscillator and tunable circuit means including a tunable circuit receiving at an input thereof a signal from an antenna or other signal input apparatus, the tunable circuits cooperating with the tunable oscillator to provide an intermediate frequency signal at an output of the tuner circuit, the tuner circuit having means associated therewith for a user to select a target frequency at which the tuner is to be tuned, the improvement comprising:

tuning means cooperatively coupled to the tunable circuit means and responsive to the target frequency selection means for individually, automatically, and successively tuning each tunable circuit to the selected target frequency.

2. The improvement of claim 1 wherein said tuning means comprises:

means for inputting a signal at the target frequency to the tunable circuit means; and adjustment means coupled to receive said target frequency signal from the tunable circuits as modified thereby, and responding thereto to vary the tuning of sucessive ones of said tunable circuits to adjust the output level of each tunable circuit, whereby each tunable circuit is successively and individually tuned to the selected target frequency.

3. The improvement of claim 2 wherein said adjustment means is coupled to maximize the output level of each tunable circuit.

4. The improvement of claim 2 wherein said target frequency inputting means comprises:

a phase locked loop system having a selectable reference oscillator associated therewith, said phase locked loop cooperatively coupled to the tunable oscillator to lock said tunable oscillator to the target frequency; and means selectively coupling the output of the tunable oscillator to an input of the set of tunable circuits.

5. The improvement of claim 2 wherein said tunable circuits comprise varactor-tuned circuits, and wherein said adjustment means comprises:

a set of voltage step generators each corresponding to and controlling only one varactor tuned circuit;

detection means for sensing the DC output level of each varactor-tuned circuit; and a microprocessor responding to said detection means and coupled to adjust each of said voltage step generators.

6. The improvement of claim 5 further including a storage means for storing signals corresponding to the optimum settings of said voltage generators for a target frequency.

7. The improvement of claim 5 further including memory means for providing a signal to set a varactor-tuned circuit to a fixed frequency during selected times during which another varactor-tuned circuit is being tuned.

8. In a tuner circuit of the type having a tunable oscillator and a set of tunable circuits receiving at an input thereof a signal from an antenna or other signal input apparatus, the tunable circuits cooperating with the tunable oscillator to provide an intermediate frequency signal at an output of the tuner circuit, the tuner circuit having means associated therewith for a user to select a target frequency at which the tuner is to be tuned, the improvement comprising:

a set of frequency controllers each controllingly coupled to a respective one of the tunable circuits; and means for applying a signal at the target frequency to the input of the set of tunable circuits and for controlling each of said frequency controllers to maximize the output of the corresponding tuned circuits when said target frequency signal is inputted to the tuned circuit set, whereby the tuner circuit accurately responds to selection of a target frequency by the user.

9. The improvement of claim 8 further including storage means coupled to said applying and controlling means for storing signals corresponding to tuning states of the tuned circuit set.

10. The improvement of claim 9 further including a memory means coupled to said applying and controlling means for storing a signal corresponding to nominal initial tuning states for a corresponding tunable circuit, said initial tuning memory being coupled to said corresponding tunable circuit.

11. The improvement of claim 8 wherein said applying and controlling means includes:

means for selectively coupling an output of the tunable oscillator to the input of the tuned circuit set;

a phase locked loop system cooperatively coupled to the oscillator;

detection means responsively coupled to an output of the tunable circuit set for providing a signal representative of the correlation between the tuning of the tunable circuit set and the target frequency signal applied thereto by said applying means; and logic means coupled to said detection means to receive the output thereof and coupled to control said phase locked loop and said frequency controllers.

12. The improvement of claim 11 wherein said logic means responds to selection of a new target frequency by:

controlling the oscillator output to be coupled to the input of the tunable circuit set by said selective coupling means;

controlling said phase locked loop system to tune the oscillator to the selected target frequency;

tuning one tunable circuit to said corresponding reference signal by varying tuning while maintaining the tuning of the other tunable circuits until the output of said detection means is maximized;

tuning each other of the tunable circuits in the same manner; and then controlling the oscillator output to be decoupled by said selective coupling means from the input of the tunable circuit set.

13. The improvement of claim 11 wherein said means for selectively coupling comprises a p-i-n diode switch.

14. The improvement of claim 11 wherein the tunable circuit set includes a varactor tuned circuit, and wherein said frequency controller corresponding to said varactor tuned circuit comprises a voltage step generator.

15. The improvement of claim 11 wherein said detection means includes a DC detector.

16. A self-tracking tuner comprising:

a set of varactor-tuned circuits;

antenna means for coupling a signal to be tuned by said tuner to said set of varactor-tuned circuits;

an oscillator;

a respective controllable voltage generator for each of said varactor-tuned circuits, each of said voltage generators having an output controlling the tuning of its corresponding varactor-tuned circuit;

a controllable oscillator control circuit coupled to said oscillator for controlling the frequency of oscillation thereof;

controllable means for selectively inputting the output of said oscillator to the varactor-tuned circuits;

output detection means coupled to said varactor-tuned circuits for deriving a signal based on the output thereof;

means for a user to select a target frequency for the self-tracking tuner;

a logic means responsively coupled to said target frequency selection means, controllingly coupled to said oscillator control circuit, controllingly coupled to said means for selectively inputting, responsively coupled to said output detection means, and controllingly coupled to said voltage generators, said logic means separately controlling each varactor-tuned circuit via its corresponding voltage generator according to a function of the signal outputted by said output detection means.

17. The tuner of claim 16 further comprising a memory device for storing control signals for each varactor-tuned circuit.

18. A method for automatically tuning a set of tunable circuits in a tuner circuit for a user-selected target frequency comprising:

locally-generating and inputting a signal related to the target frequency to the set of tunable circuits;

automatically and electronically varying the tuning of one tunable circuit while maintaining the tuning state of other tunable circuits at fixed levels to maximize the output of the one tunable circuit while said locally-generated signal is being applied thereto, whereby said one tunable circuit is tuned; and automatically and electronically successively varying the tuning of each other tunable circuit in the same manner until each other of said tunable circuits is tuned.

19. The method of claim 18 wherein said locally generating a signal comprises generating a signal at the target frequency.

20. The method of claim 19 further including automatically and electronically altering the tuning of one tunable circuit after its output has been maximized.

21. The method of claim 18 wherein said inputting said locally generated target frequency signal comprises adjusting a phase locked loop to lock a tunable oscillator to said signal related to the target frequency, and coupling the output of said tunable oscillator to said set of tunable circuits.

22. The method of claim 18 wherein said tunable circuits are voltage controlled and wherein said varying steps includes:

monitoring the DC signal output of the set of tunable circuits;

stepping a voltage step generator which cooperates with said one tunable circuit;

automatically and electronically determining when a maxima in said DC signal output has been passed;

returning said voltage step generator to the voltage corresponding to said maxima; and storing signals corresponding to said voltage in a storage means.

23. The method claim 18 wherein said varying step includes monitoring the output of the tunable circuit which ultimately receives signals as operated upon by all other tunable circuits of the tunable circuit set.

24. The method of claim 18 wherein said varying step includes monitoring the output of each tunable circuit of the set of tunable circuits.

* * * * *